United States Patent
Podges

(10) Patent No.: US 9,682,451 B2
(45) Date of Patent: Jun. 20, 2017

(54) DISASSEMBLY FIXTURE, APPARATUS, AND METHOD FOR AN ELECTRONIC DEVICE

(71) Applicant: Apple Inc., Cupertino, CA (US)

(72) Inventor: Drew A. Podges, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 456 days.

(21) Appl. No.: 14/222,298

(22) Filed: Mar. 21, 2014

(65) Prior Publication Data

US 2015/0271961 A1   Sep. 24, 2015

(51) Int. Cl.
| | |
|---|---|
| B23P 19/00 | (2006.01) |
| B23P 19/04 | (2006.01) |
| B25B 11/00 | (2006.01) |
| H05K 13/04 | (2006.01) |

(52) U.S. Cl.
CPC ............ B23P 19/04 (2013.01); B25B 11/005 (2013.01); H05K 13/0486 (2013.01); *Y10T 29/49002* (2015.01); *Y10T 29/53274* (2015.01)

(58) Field of Classification Search
CPC ........ Y10T 156/1008; Y10T 29/53274; B01D 61/10

USPC ........ 29/762, 426.4, 564.1, 592.1, 764, 770; 445/2, 61

See application file for complete search history.

(56) References Cited

U.S. PATENT DOCUMENTS 7,150,804 B2 * 12/2006 Tajima .................. G09F 7/18
                                                       156/707

* cited by examiner

*Primary Examiner* — Thiem Phan
(74) *Attorney, Agent, or Firm* — Downey Brand LLP

(57) ABSTRACT

Apparatuses, fixtures, methods, and computer program products for disassembling devices are provided. A disassembly apparatus may include first and second disassembly fixtures and an actuator configured to provide a separation force therebetween. Suction may be employed to respectively engage first and second separable portions of a device with the first and second fixtures. Channels defined in an engagement member and surrounded by a sealing member may facilitate such engagement. Further heaters may be employed to loosen a pressure sensitive adhesive or other bonding material.

20 Claims, 17 Drawing Sheets

DISASSEMBLY FIXTURE, APPARATUS, AND METHOD FOR AN ELECTRONIC DEVICE

FIELD

The present disclosure relates generally to disassembly of devices, and more particularly to a fixture, apparatus, and method configured to disassemble an electronic device.

BACKGROUND

Electronic devices often include multiple portions that are coupled together during assembly thereof. Such assembly may include certain fastening methods and mechanisms that may not be easily reversible. Accordingly, such devices may not be configured for disassembly using conventional techniques and methods.

For example, certain electronic devices may include a first separable portion and a second separable portion that may be bonded or adhered together. By way of further example, an electronic device may include a cover panel (e.g., cover glass) adhered to a housing via pressure sensitive adhesive. Further, the configuration of the engagement between the cover panel and the housing may make it difficult to pry apart or otherwise separate the housing from the cover panel using conventional tools.

Such disassembly may be desirable in that it may allow for repair of the electronic device. Alternatively, disassembly may allow for removal and reuse of components of the electronic device in other electronic devices. Accordingly, despite challenges associated with disassembly, such disassembly may be desirable.

Accordingly, the present disclosure is directed to fixtures, apparatuses, and methods configured to facilitate disassembly of devices such as electronic devices.

SUMMARY

A disassembly apparatus may include first and second disassembly fixtures which are configured to respectively engage first and second separable portions of an electronic device. For example, the first disassembly fixture may engage a cover panel of the electronic device and the second disassembly fixture may engage a housing of the electronic device. Engagement therebetween may occur via use of suction. In this regard, the first and second disassembly fixtures may include engagement bodies with suction effectors coupled thereto that facilitate engagement with a respective portion of the electronic device. Thereby, when an actuator is actuated to produce a separation force, the separable portions of the electronic device may separate.

In certain embodiments the suction effectors may comprise channels in the face of the engagement bodies and a sealing member may extend around the perimeter of the channels such that a large surface area is employed to apply suction to a respective portion of the electronic device. Further, body heaters may heat the engagement bodies to assist in releasing, for example, pressure sensitive adhesive. Localized heaters, positioned at particular locations at which the pressure sensitive adhesive is located, may further assist in loosening the pressure sensitive adhesive by briefly and locally heating the electronic device to a great temperature than the temperature at which the body heater heats the electronic device. Further, use of linear separation of the first and second separable portions may reduce bending of the cover panel, which could damage the cover panel and/or other components.

Other apparatuses, methods, features and advantages of the disclosure will be or will become apparent to one with skill in the art upon examination of the following figures and detailed description. It is intended that all such additional systems, methods, features and advantages be included within this description, be within the scope of the disclosure, and be protected by the accompanying claims.

BRIEF DESCRIPTION OF THE DRAWINGS

The included drawings are for illustrative purposes and serve only to provide examples of possible structures and arrangements for the disclosed apparatuses, assemblies, methods, and systems. These drawings in no way limit any changes in form and detail that may be made to the disclosure by one skilled in the art without departing from the spirit and scope of the disclosure.

DETAILED DESCRIPTION

Figure 1:
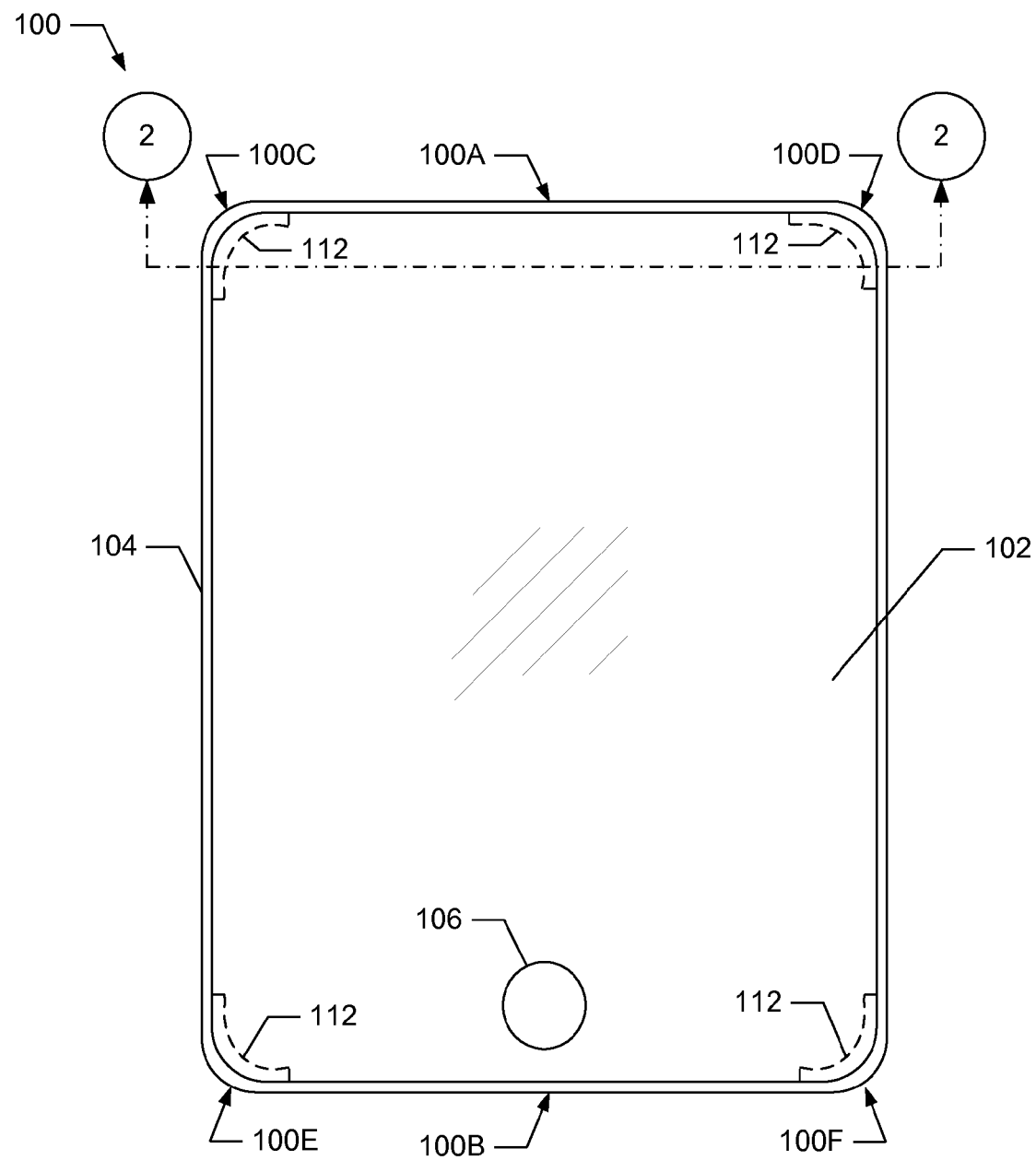
FIG. 1 illustrates an overhead view of an electronic device in the form of a tablet computing device according to an example embodiment of the present disclosure.

Representative applications of systems, apparatuses, computer program products and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

As described in detail below, the following relates to disassembly apparatuses, fixtures, computer program products, and methods. Embodiments of the disclosure may be employed to disassemble a variety of devices, and in particular electronic devices such as tablet computing devices, phones, and/or any other device including two or more separable portions.

In one embodiment a disassembly apparatus may include first and second disassembly fixtures which are configured to respectively engage first and second separable portions of an electronic device. For example, the first disassembly fixture may engage a cover panel of the electronic device and the second disassembly fixture may engage a housing of the electronic device. Engagement therebetween may occur via use of suction. In this regard, the first and second disassembly fixtures may include engagement bodies with suction effectors coupled thereto that facilitate engagement with a respective portion of the electronic device. Thereby, when an actuator is actuated to produce a separation force therebetween, the separable portions of the electronic device may separate.

In certain embodiments the suction effectors may comprise channels in the face of the engagement bodies and a sealing member may extend around the perimeter of the channels such that a large surface area is employed to apply suction to a respective portion of the electronic device. Further, body heaters may heat the engagement bodies to assist in releasing pressure sensitive adhesive. Localized heaters, positioned at particular locations at which the pressure sensitive adhesive is located, may further assist in loosening the pressure sensitive adhesive by briefly and locally heating the electronic device to a great temperature than the temperature at which the body heater heats the electronic device. Thereby, issues with respect to heating the components of the electronic device beyond a temperature at which damage occurs may be avoided. In this regard, for example, magnets may lose magnetism when heated beyond a threshold temperature.

These and other embodiments are discussed below with reference to the figures. However, those skilled in the art will readily appreciate that the detailed description given herein with respect to these figures is for explanatory purposes only.

Various embodiments of devices, and particularly embodiments of electronic devices including a display may benefit from embodiments of the present disclosure. In this regard, FIG. 1 illustrates an overhead view of an example embodiment of an electronic device in the form of a tablet computing device 100. The tablet computing device 100 may include a cover panel 102 and a housing 104 that define at least a portion of an outer surface thereof.

The cover panel 102 may comprise glass, plastic, crystal, or any other material configured to allow light to travel therethrough. In this regard, as described hereinafter, a display assembly may be positioned under the cover panel 102 and within the housing 104. In certain embodiments the cover panel 102 may be configured to receive inputs. For example, the display assembly may cooperate with the cover panel 102 to define a touch screen.

The housing 104 may be configured to provide the tablet computing device 100 with structure and support. In this regard, the housing 104 may preferably comprise a relatively rigid member. For example, the housing 104 may comprise a metal such as an aluminum alloy that defines a lightweight, yet rigid structure. However, various other materials including other metals (e.g., titanium, steel), plastic, and glass, etc. may be employed in the housing 104.

As noted above, in some embodiments the tablet computing device 100 may include a touchscreen. In some embodiments various other inputs and/or outputs may be provided. For example, the tablet computing device 100 may include a button 106 in some embodiments. As illustrated, the button 106 may be at least partially surrounded by the cover panel 102 in some embodiments. Various other inputs and/or outputs may be provided, such as a camera, a speaker, an audio port, an electrical port, a data port, etc., which may be provided in any quantity and any location, which may be combined or provided as separate elements.

Figure 2:
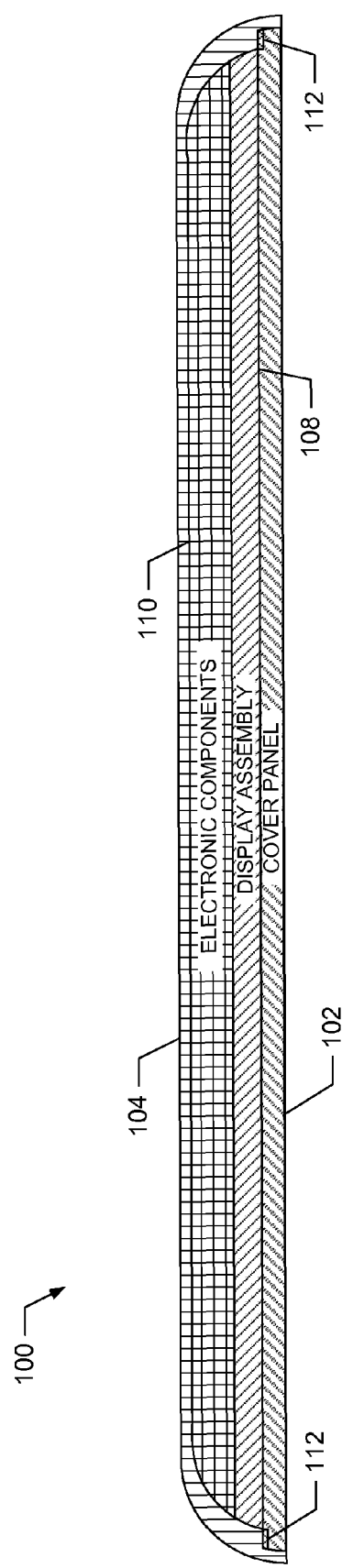
FIG. 2 illustrates a section view through the portablet computing device along line 2-2 from FIG. 1.

FIG. 2 illustrates a sectional view through the tablet computing device 100. As illustrated, the cover panel 102 and the housing 104 may define at least part, and in some embodiments substantially all, of the exterior of the tablet computing device 100. A display assembly 108 may be positioned inside of the cover panel 102 and within the housing 104. In this regard, the display assembly 108 may be positioned adjacent (e.g., in contact with) the cover panel 102 in order to provide for output of light therethrough and, optionally, to receive inputs through the cover panel in embodiments in which the tablet computing device 100 includes a touchscreen. The display assembly 108 may or may not be affixed to the cover panel 102. The display assembly 108 can display visual content such as a graphical user interface, still images such as photos as well as video media items such as movies. The display assembly 108 can display images using any appropriate technology such as a liquid crystal display (LCD), a light emitting diode (LED) display, an organic light emitting diode (OLED) display, etc.

A plurality of additional electronic components 110 may also be received in the housing 104. For example, the electronic components 110 may be positioned between the display assembly 108 and the housing 104. As may be understood, the electronic components 110 may vary depending on the particular functionality of the tablet computing device 100. However, by way of example, the electronic components 110 may include a battery, a communication interface, an antenna, a processor, memory, etc.

The cover panel 102 may be indirectly or directly fastened to the housing 104 so as to retain the tablet computing device 100 in the assembled configuration. In this regard, the cover panel 102 may secured to the housing 104 via a variety of methods and means. For example, interference fit, fasteners, and/or adhesives, etc. may be employed to fasten the cover panel 102 to the housing 104.

In one embodiment, as illustrated in FIGS. 1 and 2, a pressure sensitive adhesive 112 may be employed to secure the cover panel 102 to the housing. The pressure sensitive adhesive 112 may comprise a double-sided tape. The pressure sensitive adhesive 112 may evenly extend around the perimeter of the cover panel 102 in some embodiments. In an alternative embodiment the pressure sensitive adhesive 112 may be positioned at limited portions of the perimeter of the cover panel 102. For example, the pressure sensitive adhesive 112 may be positioned at first and second opposing ends 100A, 100B of the tablet computing device 100. In this regard, in some embodiments, as illustrated in FIG. 1, the pressure sensitive material 112 may be positioned at each of a plurality of corners 100C-F of the tablet computing device 100. The pressure sensitive material 112 may be disposed in various other configurations, such as along the edges of the cover panel 102 proximate the first and second opposing ends 100A, 100B of the tablet computing device 100. In another embodiment the pressure sensitive material 112 may be disposed around the perimeter of the cover panel 102 with extra pressure sensitive material employed at one or more locations such as at the corners 100C-F. In this regard, the position of the pressure sensitive material 112 may be selected to define an optimal coupling between the cover panel 102 and the housing 104.

Accordingly, the cover panel 102 may be securely coupled to the housing 104. Use of pressure sensitive adhesive 112 may be desirable in that it may provide for a secure connection while hiding the securing mechanism from view, which may provide a pleasing exterior appearance. While use of the pressure sensitive adhesive 112 and/or other coupling mechanisms to couple the cover panel 102 to the housing 104 may provide a secure connection therebetween, in certain instances disassembly of the tablet computing device 100 may be desirable. Further, as a result of the cover panel 102 optionally defining a recessed configuration with respect to the housing 104 or otherwise defining a configuration in which edges thereof are substantially inaccessible, it may be difficult to decouple the cover panel from the housing.

Figure 3:
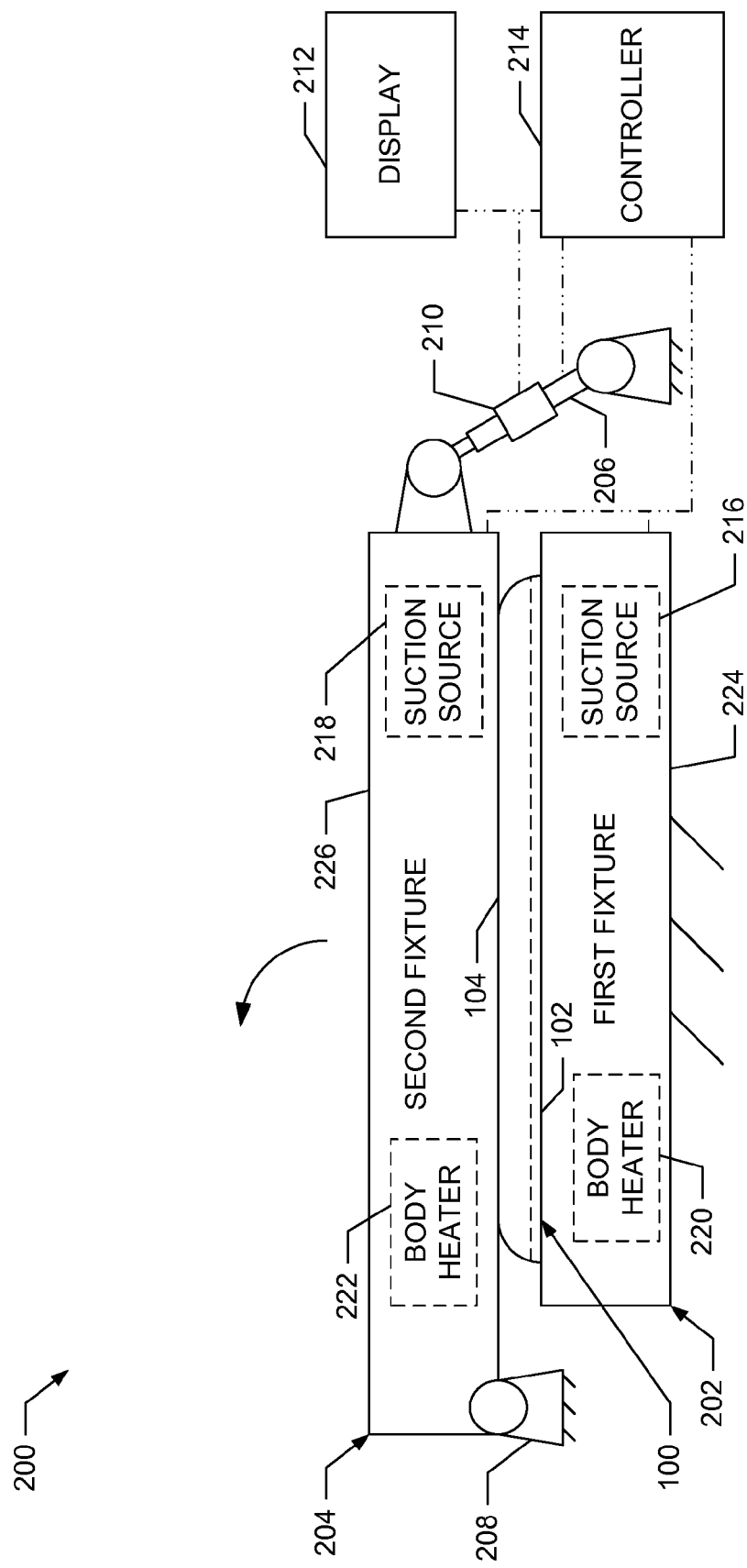
FIG. 3 schematically illustrates a side view of a disassembly apparatus configured to hingedly disassemble an electronic device, prior to disassembly thereof, according to an example embodiment of the present disclosure.

Accordingly, embodiments of the present disclosure are directed to disassembly apparatuses configured to separate first and second separable portions of devices (e.g., the tablet computing device 100, or other electronic devices). In this regard, FIG. 3 schematically illustrates an embodiment of a disassembly apparatus 200 according to an embodiment of the present disclosure. As illustrated, the disassembly apparatus 200 may include a first disassembly fixture 202 and a second disassembly fixture 204. The first disassembly fixture 202 may be configured to engage a first separable portion of an electronic device (e.g., the cover panel 102 of the tablet computing device 100). Similarly, the second disassembly fixture 204 may be configured to engage a second separable portion of the electronic device (e.g., the housing 104 of the tablet computing device 100).

Depending on the particular construction of the device undergoing disassembly, the first separable portion and the second separable portion may comprise a cover panel and a housing, as described above. Thus, for purposes of brevity, the device undergoing disassembly is generally referred to as the tablet computing device 100 and the first and second separable portions are generally referred to hereinafter as comprising the cover panel 102 and the housing 104. However, as may be understood, the first and second separable portions may comprise various other components depending on the particular construction of the device undergoing disassembly, and such device may vary. For example, the disassembly apparatuses of the present disclosure may be configured to disassemble any device comprising two or more separable portions. Thus, for example, the disassembly devices of the present disclosure may also be suited to disassembling televisions, monitors, smartphones, laptops, etc.

As illustrated in FIG. 3, the disassembly apparatus 200 may further comprise an actuator 206 configured to apply a force to separate the cover panel 102 from the housing 104 of the tablet computing device 100. The actuator 206 may comprise a pneumatic piston, a hydraulic piston, a lever, a robotic arm, or any other embodiment of manual or automated actuator.

As illustrated, in some embodiments the disassembly apparatus 200 may be configured to hingedly displace the second disassembly fixture 204 away from the first disassembly fixture 202. Use of a hinged, or pivoting configuration may be desirable in that it may concentrate force on an edge of the tablet computing device 100 (e.g., proximate one of the first and second opposing ends 100A, 100B) such that separation initially starts at this edge and encourages further separation. In this regard, in some embodiments the second disassembly fixture 204 may be coupled to a hinge 208 about which the second disassembly fixture pivots as the actuator 206 applies the force to separate the cover panel 102 from the housing 104. Alternatively, in embodiments in which the actuator comprises a robotic arm, the robotic arm may be configured to move the second disassembly fixture along a path that mimics the arc associated with hingedly decoupling the housing from the cover panel. However, as will be described below, a hinged decoupling path may not be preferable in some instances.

The disassembly apparatus 200 may further comprise a load cell 210 configured to detect a load applied between the cover panel 102 and the housing 104 of the tablet computing device 100. In this regard, the load cell 210 may be coupled to the actuator 206 or otherwise positioned to detect the load applied between the cover panel 102 and the housing 104. In one embodiment the load cell 210 may comprise a strain gauge. In some embodiments the load cell 210 may be in communication with a display 212 that outputs an indicator of the load. Alternatively, or additionally, the load cell 210 may be in communication with a controller 214. The controller 214 may be configured to control the actuator 206 so as to application of the force to separate the cover panel 102 from the housing 104 and perform various other functions as described hereinafter.

During movement of the second disassembly fixture 204 away from the first disassembly fixture 202, it may be desirable to limit the force separating the cover panel 102 from the housing 104 below a threshold force. In this regard, as may be understood, damage may occur to the cover panel 102, the housing 104, and/or other components of the tablet computing device 100 in instances in which too much force is applied. Accordingly, the amount of force applied may be limited below a threshold force at which damage occurs, which may be empirically determined in some embodiments. Control in this manner may be conducted manually via an operator monitoring the display 212, or the controller 214 may direct actuation of the actuator 206 such that the threshold force is not exceeded based on input from the load cell 210.

Similarly, a separation distance between the cover panel 102 and the housing 104 may be limited. In this regard, as the cover panel 102 and the housing 104 separate, it may be necessary to disconnect a cable or other connector extending therebetween, particularly in embodiments in which the display assembly 108 and/or other components are coupled to the cover panel. Thus, for example, a mechanical stop may be employed to limit movement of the second disassembly fixture 204.

Figure 4:
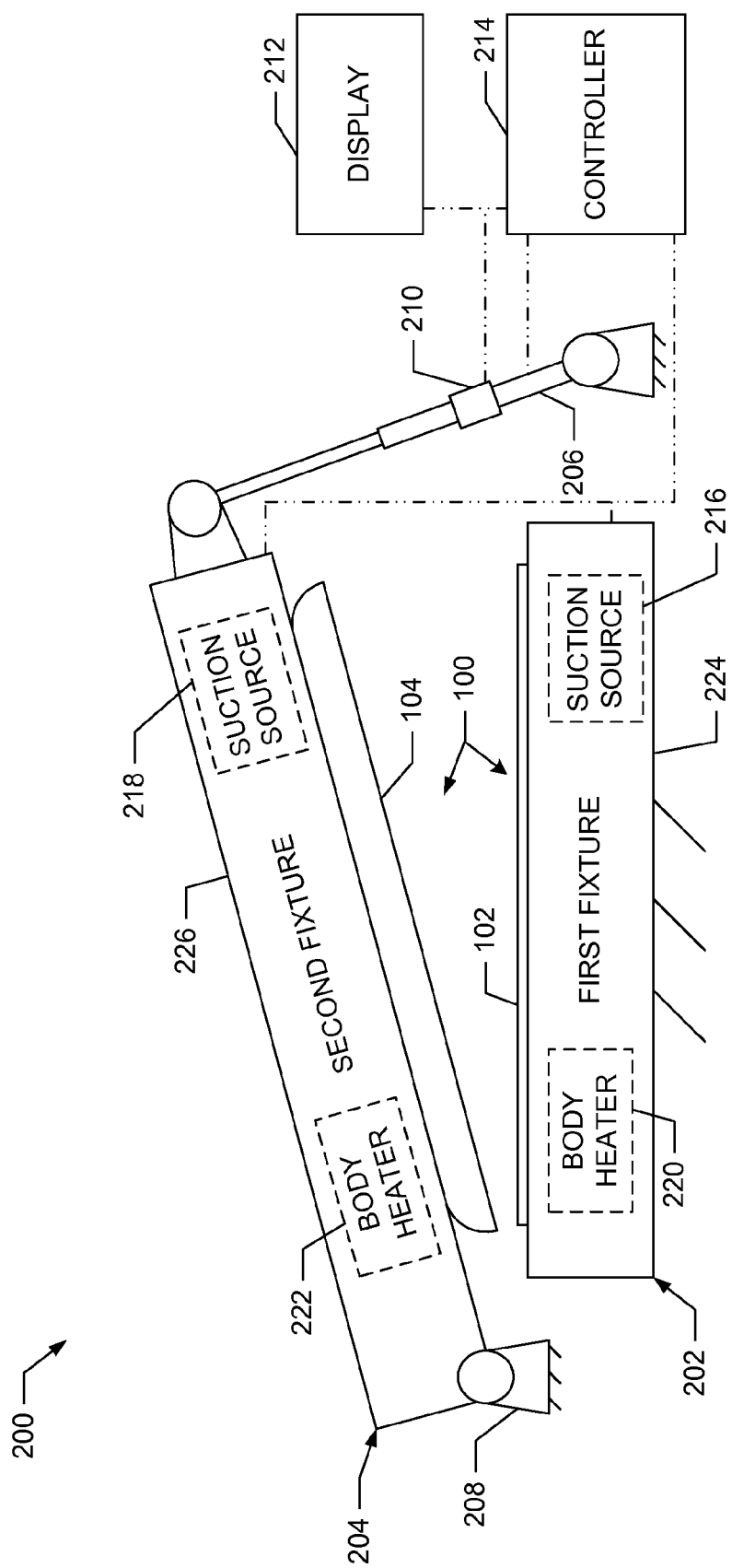
FIG. 4 schematically illustrates the disassembly apparatus of FIG. 3, after disassembly of the electronic device, according to an example embodiment of the present disclosure.

However, in some embodiments the second disassembly fixture 204 may be configured to move to a greater separation distance following stopping at the intermediate separation distance. Thereby, for example, the housing 104 may be completely separated from the cover panel 102 following disconnection of the cable or other connector at the intermediate separation distance. In this regard, the controller 214 may be configured to initially stop at the intermediate separation distance and then extend the separation distance thereafter upon operator confirmation that the cable or other connector is disconnected to completely separate the housing 104 from the cover panel 102, as illustrated in FIG. 4.

In the example provided above, the second disassembly fixture 204 is generally described as moving and the first disassembly fixture 202 is generally described as being stationary. However, in other embodiments the first disassembly fixture could move and the second disassembly fixture could be stationary, or both the first disassembly fixture and the second disassembly fixture could move. In this regard, relative movement between the first disassembly fixture and the second disassembly fixture could occur in a variety of manners.

In order to facilitate separation in the manner described above, the first and second disassembly fixtures 202, 204 may comprise certain features. In this regard, the first disassembly fixture 202 and the second disassembly fixture 204 may employ one or more of various techniques to grasp the cover panel 102 and the housing 104. For example, mechanical grippers may be configured to grasp one or both of the cover panel 102 and the housing 104 in some embodiments. However, in some embodiments it may be preferable or necessary to employ suction to grasp one or both of the cover panel 102 and the housing 104. In this regard, the cover panel 102 may be positioned in a flush or recessed configuration such that disassembly of the cover panel 102 from the housing 104 via mechanical interference-based grippers may be difficult or impossible. Further, use of suction may allow for distribution of loads, so as to avoid damaging, for example, the housing 104.

Accordingly, the disassembly apparatus 200 may include one or more suction sources configured to produce suction. As may be understood the suction sources may comprise air pumps configured to produce suction. The suction may be applied to the tablet computing device 100 to provide coupling therebetween.

In the illustrated embodiment the first disassembly fixture 202 comprises a first suction source 216 and the second disassembly fixture 204 includes a second suction source 218. However, in other embodiments a single suction source may be connected to both the first disassembly fixture 202 and the second disassembly fixture 204. Alternatively, the first disassembly fixture 202 may include a suction source to couple to the cover panel 102 and the second disassembly fixture 204 may include physical means (e.g., interference-based grippers) to engage the housing 104 or conversely the second disassembly fixture 204 may include a second suction source to couple to the housing 104 and the first disassembly fixture 202 may include physical means (e.g., grippers) to engage the cover panel 102, in embodiments in which such engagement is possible. However, for purposes of brevity the first disassembly fixture 202 and the second disassembly fixture 204 are generally described herein as each including a suction source.

As further illustrated in FIG. 3, in some embodiments the first disassembly fixture 202 and/or the second disassembly fixture 204 may include a body heater. In the illustrated embodiment the first disassembly fixture 202 includes a first body heater 220 and the second disassembly fixture 204 includes a second body heater 222. The first body heater 220 and the second body heater 222 may be configured to heat the tablet computing device 100. In this regard, by heating the tablet computing device 100, the pressure sensitive adhesive 112 may be loosened such that disassembly of the tablet computing device is facilitated.

In order to transfer suction from the suction sources 216, 218 and transfer heat from the body heaters 220, 222 to the tablet computing device 100, the first disassembly fixture 202 may comprise a first engagement body 224 and the second disassembly fixture 204 may comprise a second engagement body 226. The engagement bodies 224, 226 may comprise materials such as brass or copper that are configured to transfer heat. The engagement bodies 224, 226 may be configured to engage a respective portion of the tablet computing device 100 so as to transfer suction and/or heat thereto. In particular, the first engagement body 224 may engage the cover panel 102 and the second engagement body 226 may engage the housing 104.

The second disassembly fixture 204, including the second engagement body 226 may be substantially similar to the first disassembly fixture 202, including the first engagement body 224. Accordingly, for brevity purposes, only the first disassembly fixture 202 and the first engagement body 224 are described in detail hereinafter. However, it should be understood that description with respect to the first disassembly fixture 202 may be equally applicable to the second disassembly fixture 204 in terms of physical features and interaction with an opposing portion (e.g., the housing 104) of the tablet computing device 100.

Figure 5:
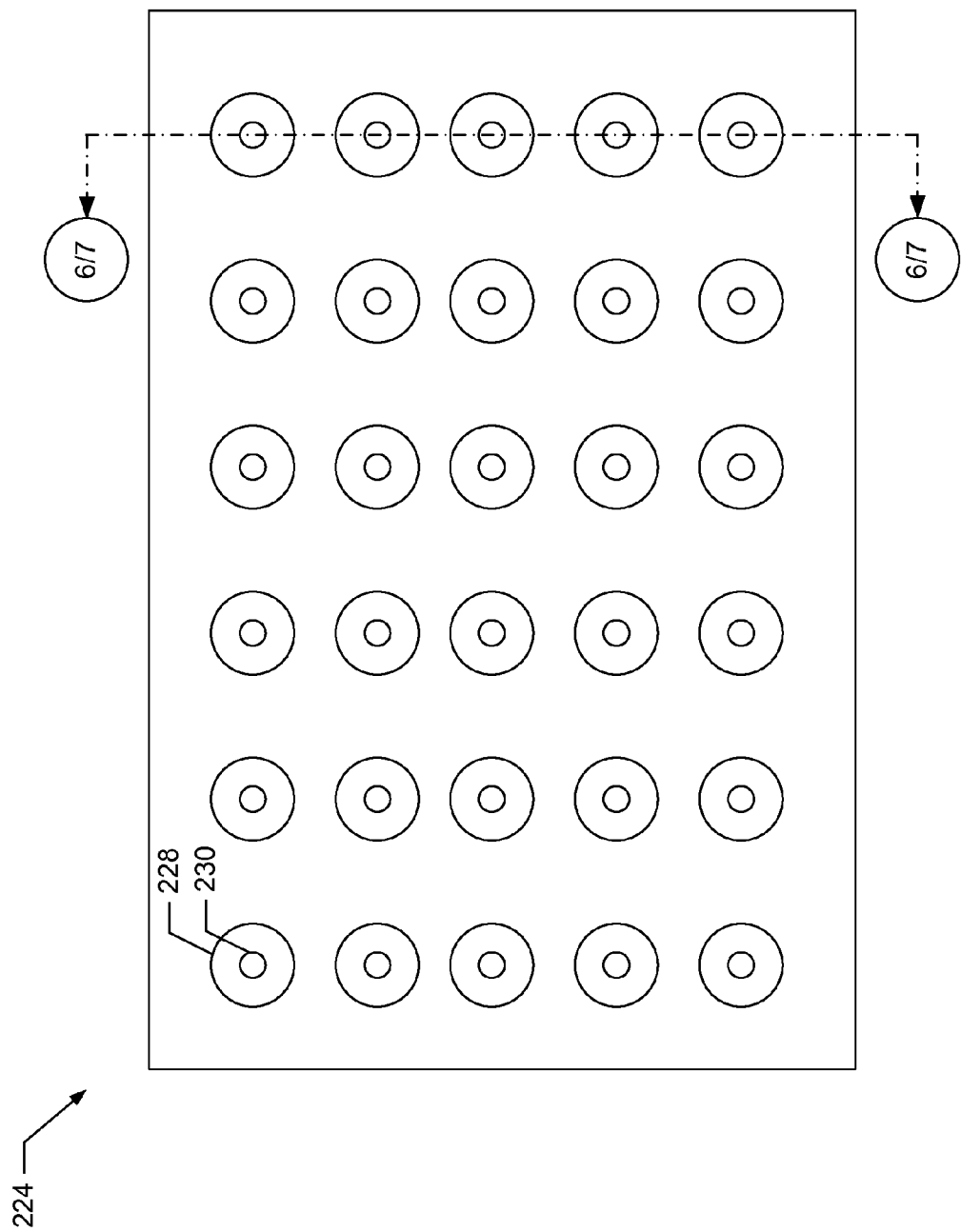
FIG. 5 illustrates an overhead view of an engagement body of the disassembly apparatus of FIG. 3 including a plurality of suction effectors respectively in communication a connector aperture according to an example embodiment of the present disclosure.

FIG. 5 illustrates an overhead view of the first engagement body 224. The first engagement body 224 may include a plurality of suction effectors 228 coupled thereto and configured to apply the suction produced by the first suction source 216 to the tablet computing device 100 to couple the tablet computing device to the first engagement body. Further, the first engagement body 224 may include a connector aperture 230 extending therethrough to one or more of the suction effectors 228. For example, in the embodiment illustrated in FIG. 5, a respective connector aperture 230 is associated with each suction effector 228.

Figure 6:
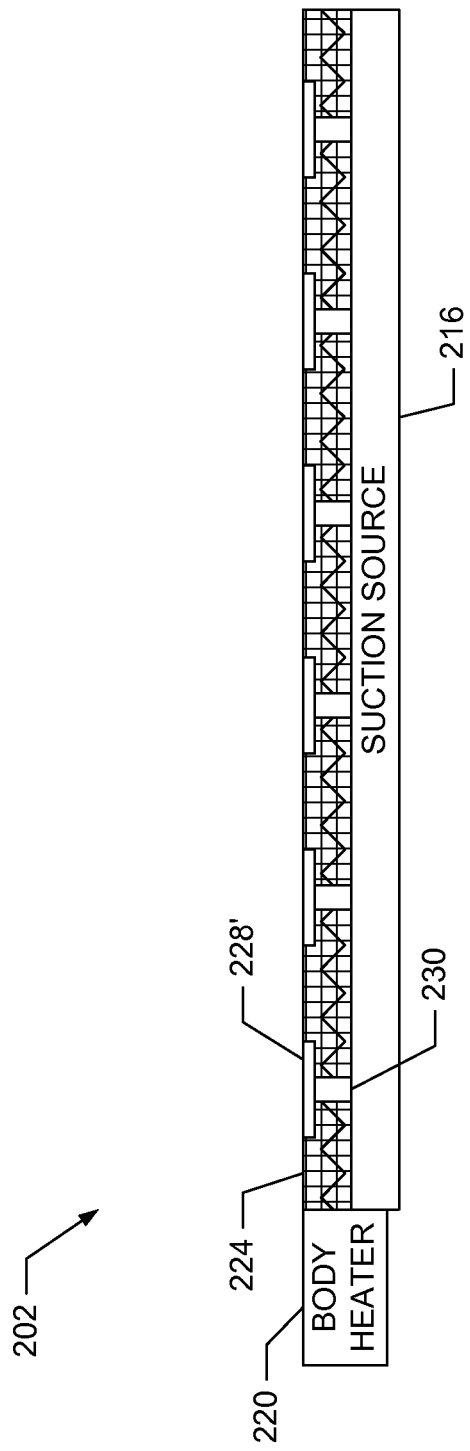
FIG. 6 schematically illustrates a sectional view through a disassembly fixture including an embodiment of the engagement body of FIG. 5 along line 6/7-6/7 in which the suction effectors comprise round apertures according to an example embodiment of the present disclosure.

FIG. 6 schematically illustrates a sectional view through the first disassembly fixture 202 of FIG. 3 in an embodiment including the first engagement body 224 of FIG. 5. As illustrated, one embodiment of the suction effectors comprises round apertures 228'. In this regard, the first engagement body 224 may be sized and shaped to correspond to the size and shape of the cover panel 102 such that the round apertures 228' may be in engagement therewith.

Figure 7:
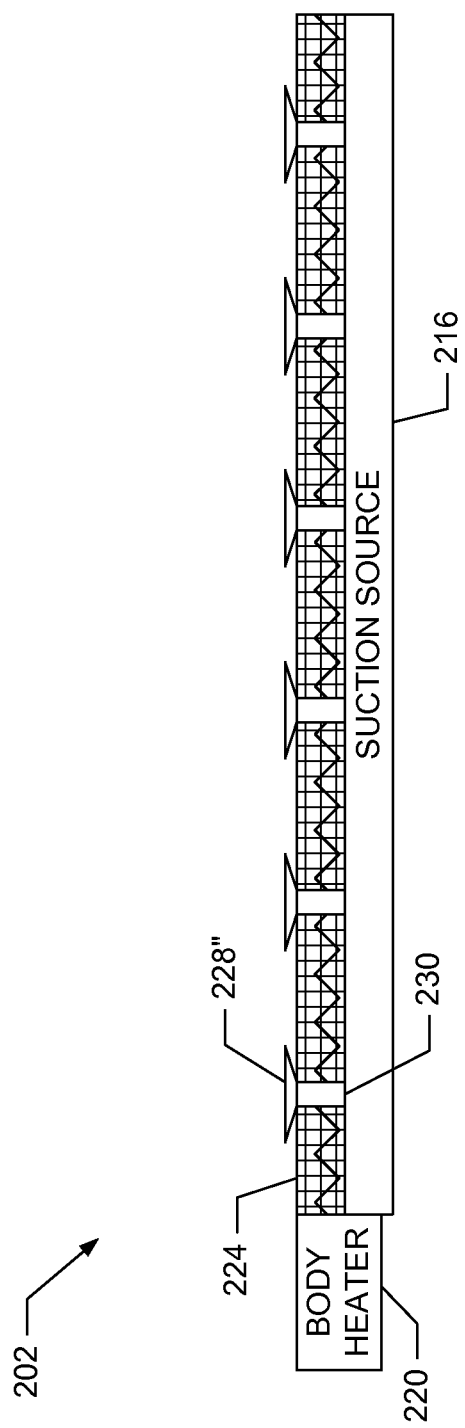
FIG. 7 schematically illustrates a sectional view through a disassembly fixture including an embodiment of the engagement body of FIG. 5 along line 6/7-6/7 in which the suction effectors comprise suction cups according to an example embodiment of the present disclosure.

However, various other embodiments of suction effectors may be employed. For example, FIG. 7 schematically illustrates a sectional view through the first disassembly fixture 202 of FIG. 3 in an alternate embodiment including the first engagement body 224 of FIG. 5. As illustrated, in this embodiment the suction effectors comprise externally extending suction cups 228". The suction cups 228" may comprise an elastomeric material configured to conform to the shape of the cover panel 102.

Accordingly, regardless of the particular embodiment, as illustrated in FIGS. 6 and 7 the first engagement body 224 may direct suction produced by the first suction source 216 through the connector aperture 230 to the suction effector 228 (e.g., the round aperture 228' or the suction cup 228"). As further illustrated in FIGS. 6 and 7, the first body heater 220 may be configured to heat substantially an entirety of the first engagement body 224. In this regard, the first body heater 220 may comprise at least one cartridge, coil, or other mechanism configured to substantially evenly heat the first engagement body 224. Accordingly, as noted above, the first body heater 220 may heat the first engagement body 224, which may thereby heat the cover panel 102 so as to loosen the pressure sensitive adhesive 112. Thereby, the disassembly apparatus 200 may employ heat and suction to disassemble the tablet computing device 100.

Figure 8:
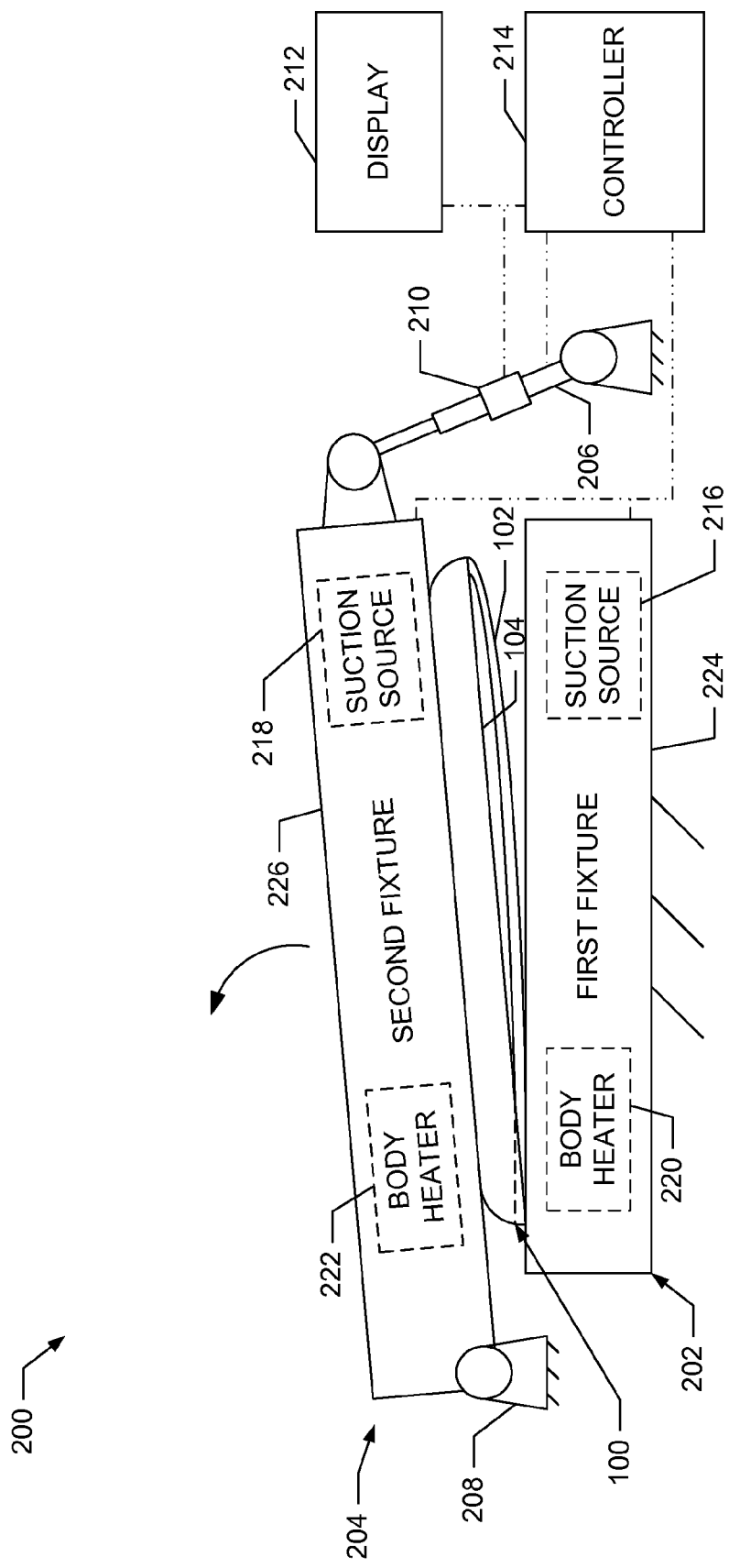
FIG. 8 schematically illustrates the disassembly apparatus of FIG. 3, during disassembly of the electronic device, according to an example embodiment of the present disclosure.

However, in some instances use of the above-described disassembly apparatus 200 may suffer from certain problems. In this regard, as illustrated in FIG. 8, in some instances disassembly of the tablet computing device 100 may result in bending of the cover panel 102. Bending of the cover panel 102 may be undesirable in that it may cause damage to the cover panel itself and/or damage to one or more components coupled thereto. For example, in embodiments in which the display assembly 108 and/or the electronic components 110 are directly or indirectly coupled to the cover panel 102, bending of the cover panel may cause damage thereto.

Figure 9:
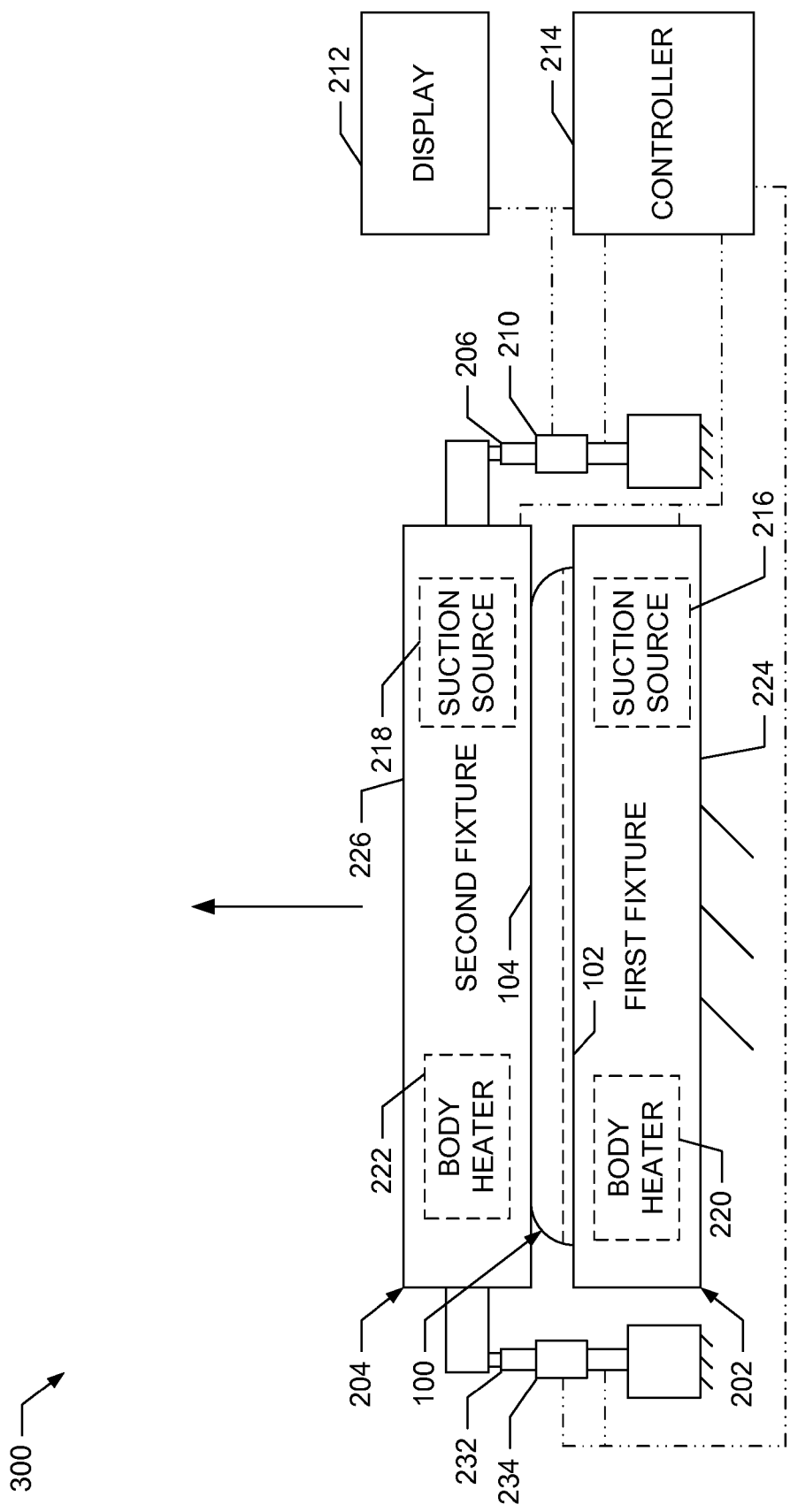
FIG. 9 schematically illustrates a side view of a disassembly apparatus configured to linearly disassemble an electronic device, prior to disassembly thereof, according to an example embodiment of the present disclosure.

Accordingly, embodiments of the present disclosure are configured to limit (e.g., substantially avoid) bending of the cover panel 102 and components coupled thereto. In this regard, FIG. 9 illustrates an alternate embodiment of a disassembly apparatus 300. The disassembly apparatus 300 illustrated in FIG. 9 may be substantially similar to the disassembly apparatus illustrated in FIG. 3 and described above. In this regard, the disassembly apparatus 300 of FIG. 9 may include the first disassembly fixture 202 and the second disassembly fixture 204 and portions thereof including, for example, the first and second suction sources 216, 218, the first and second body heaters 220, 222, and the first and second engagement bodies 224, 226. Additionally, the disassembly apparatus 300 may include the display 212 and/or the controller 214.

However, the disassembly apparatus 300 may be configured to linearly displace the housing 104 away from the cover panel 102. Accordingly, issues with respect to bending caused by hingedly disassembling the tablet computing device 100 may be substantially avoided. In this regard, linear disassembly may cause the cover panel 102 to disconnect from the housing 104 at all edges substantially simultaneously.

Figure 10:
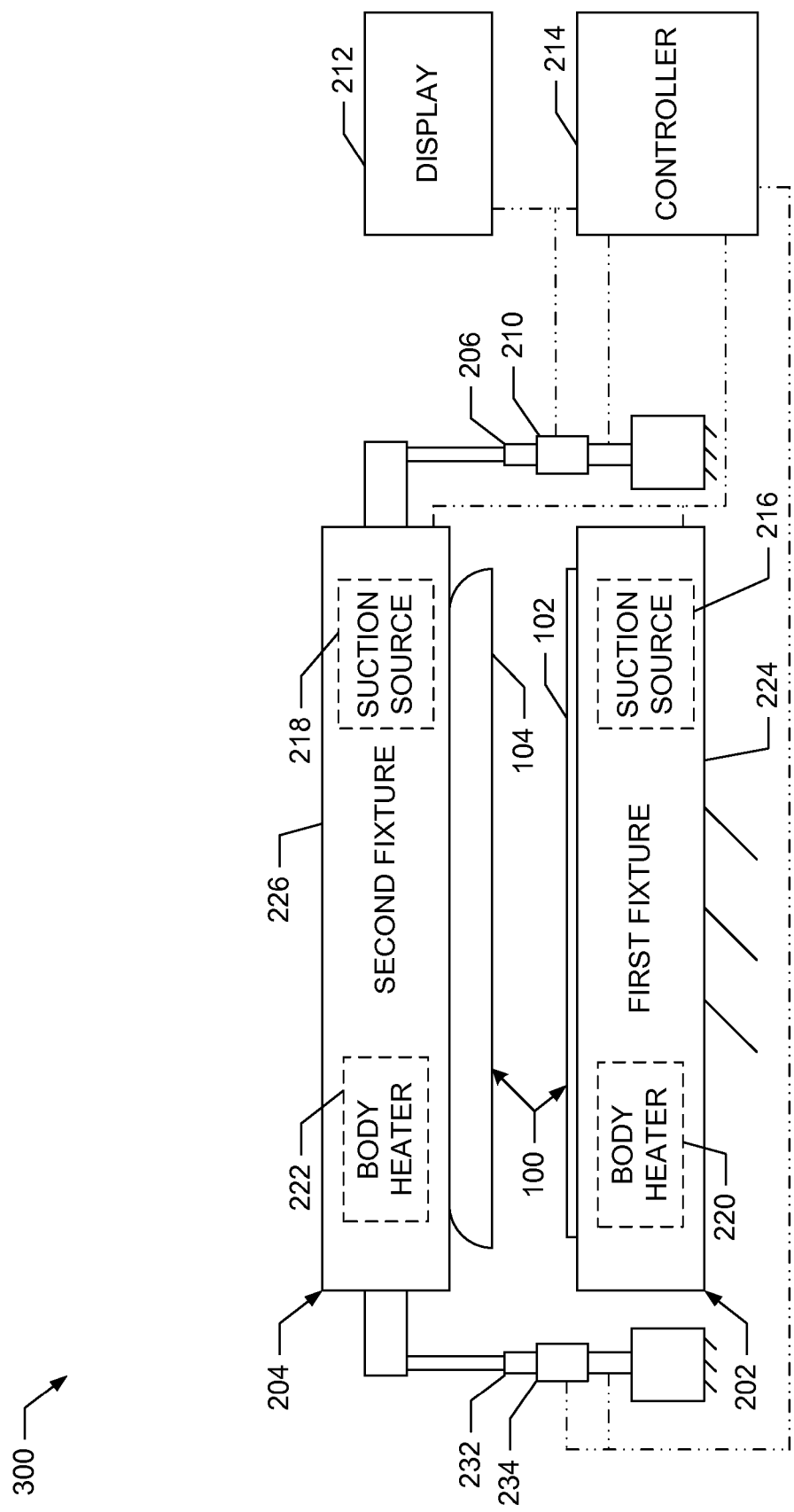
FIG. 10 schematically illustrates the disassembly apparatus of FIG. 9, after disassembly of the electronic device, according to an example embodiment of the present disclosure.

Thus, the disassembly apparatus 300 may include the actuator 206 and the load cell 210. However, the actuator 206 may be configured to linearly displace the second disassembly fixture 204 from the first disassembly fixture 202. In this regard, in the illustrated embodiment, the disassembly apparatus 300 further comprises a second actuator 232 and a second load cell 234. Accordingly, the actuators 206, 232 may each press against the second disassembly fixture 204 to linearly displace the housing 104 from the cover panel 102, as illustrated in FIG. 10. Further, the load cells 210, 234 may be employed (e.g., by the controller 214 or the operator) to ensure that separation force is evenly applied across the tablet computing device 100. However, it should be understood that linear displacement and separation may be accomplished in other manners using a smaller or greater number of actuators and load cells.

Figure 11:
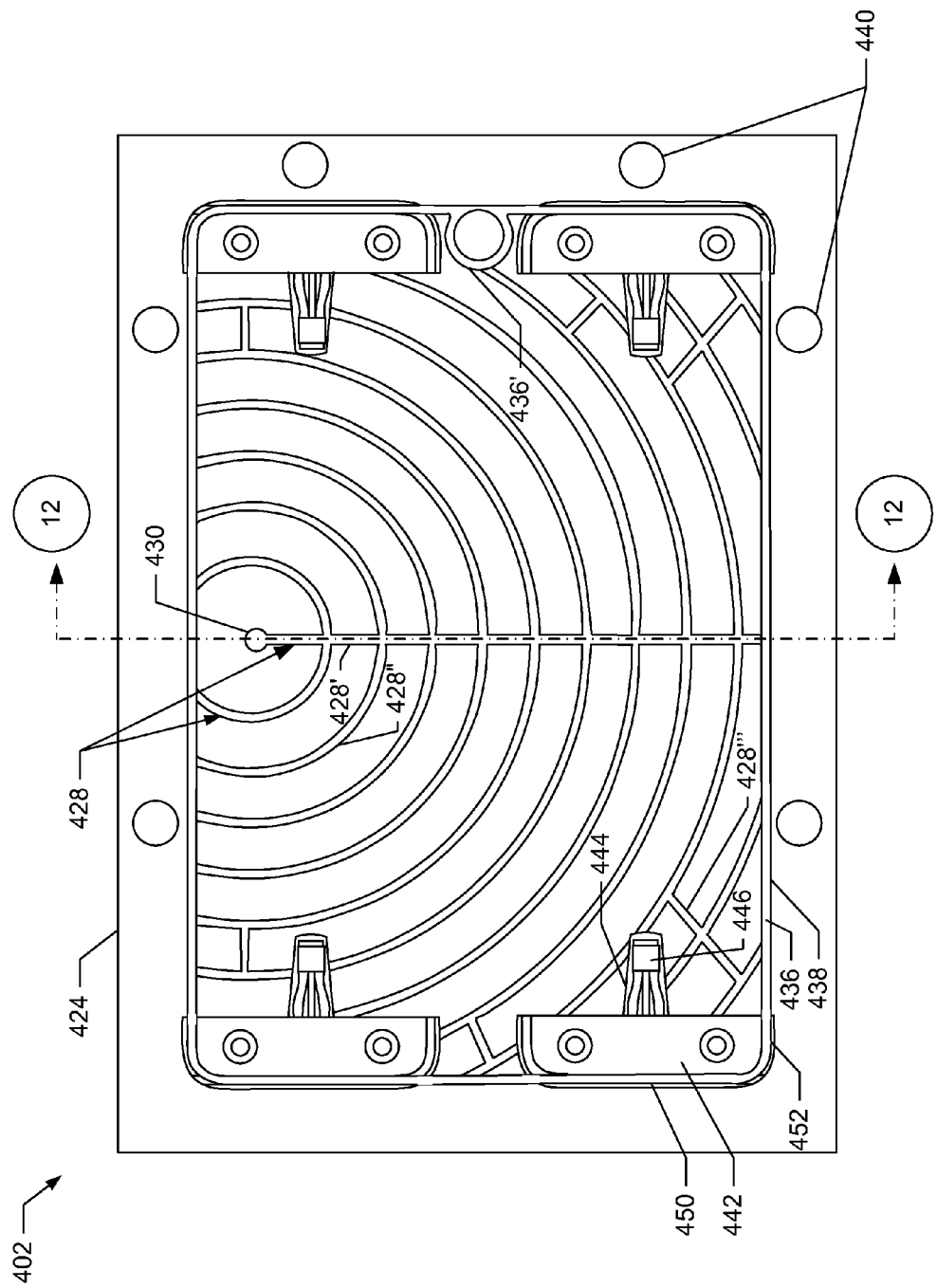
FIG. 11 illustrates an overhead view of a disassembly fixture including a plurality of localized heaters and a plurality of suction effectors comprising channels according to an example embodiment of the present disclosure.
Figure 12:
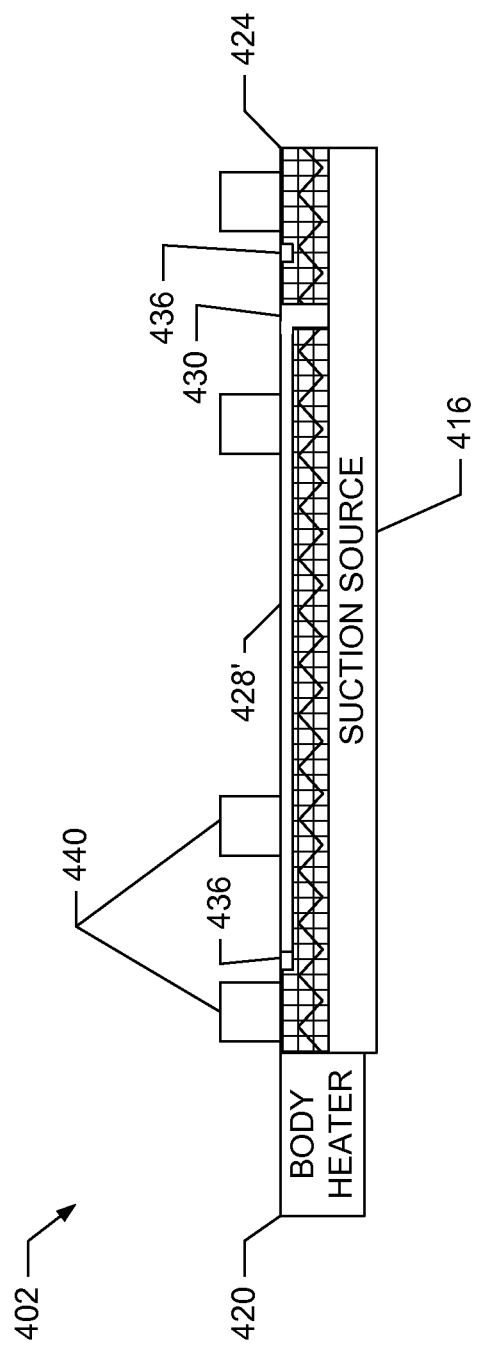
FIG. 12 schematically illustrates a sectional view through the disassembly fixture of FIG. 11 along line 12-12 and including additional components according to an example embodiment of the present disclosure.

Additional features may be configured to facilitate disassembly of devices such as the tablet computing device 100. In this regard, FIG. 11 illustrates an overhead view of a first disassembly fixture 402 according to an alternate embodiment of the present disclosure. FIG. 12 schematically illustrates a sectional view through the first disassembly fixture 402 of FIG. 11 and illustrates additional components thereof. The first disassembly fixture 402 may be employed in either of the disassembly apparatuses 200, 300 described above, or any other embodiment of disassembly apparatus. In this regard, the first disassembly fixture 402 of FIG. 11 may be employed in place of the disassembly fixture 202 described above. Similarly, a second disassembly fixture may be substantially similar to the first disassembly fixture 402. Accordingly, for purposes of brevity, details with respect to the second disassembly fixture will not be repeated.

As illustrated, the first disassembly fixture 402 may include a first engagement body 424. One or more suction effectors may be coupled to the first engagement body 424. In the illustrated embodiment, the suction effectors comprise a plurality of channels 428 defined in the engagement body 424. In this regard, in the above-described embodiments the suction effectors 228 comprised round apertures 228' or suction cups 228" which only apply suction at each respective suction effector. Thereby, a large area is defined between each suction effector 228 that does not assist in bonding the tablet computing device 100 thereto.

However, in the embodiment illustrated in FIG. 11, the channels 428 extend across a large portion of the area formed by the surface of the first engagement body 424. In this regard, suction is provided to the channels 428 via a connector aperture 430, which is in communication with a first suction source 416, as illustrated in FIG. 12. The channels 428 may include a connector channel 428' and a plurality of concentric channels 428" extending around the connector aperture 430. Thus, suction may be transferred from the connector aperture 430 through the connector channel 428' to the concentric channels 428". The channels 428 may additionally include outer connector channels 428'''. The outer connector channels 428''' may extend between the concentric channels 428" to ensure that each concentric channel receives suction directed thereto. Although various other patterns may be employed, use of the concentric channels 428" may be employed to ensure substantially even distribution of suction across the surface of the first engagement body 424.

Further, a sealing member 436 may extend around the channels 428. For example, the sealing member 436 may be received in a groove 438 defined in the first engagement body 424 and extending around the channels 428. In some embodiments the sealing member 436 may comprise an elastomeric member such as silicone. The sealing member 436 may be configured to seal against the cover panel 102 such that suction is retained within the entirety of the area defined within the sealing member 436. As illustrated in FIG. 11, the sealing member 436 may include a button portion 436' configured to surround a button (e.g., the button 106) that is at least partially surrounded by the cover panel 102. Thereby, issues with respect to undesirably applying suction to the button may be avoided. For example, suction applied to the button 106 may undesirably disengage the button from the remainder of the tablet computing device 100 and/or cause other issues.

Accordingly, as described above, use of the channels 428 and the sealing member 436 may allow suction to be applied to substantially the entirety of the cover panel 102 such that firm and even engagement between the first engagement body 424 and the cover panel may be achieved. Such even and firm engagement may assist in reducing bending of the cover panel 102 during disassembly of the tablet computing device 100. However, the first disassembly fixture 402 may additionally or alternatively include other features configured to facilitate disassembly of the tablet computing device 100.

By way of example, the first disassembly fixture 402 may include one or more alignment protrusions 440 configured to align the tablet computing device 100 with respect thereto. For example, the alignment protrusions 440 may extend from the first engagement body 424 on one or more sides of the section configured to engage the cover panel 102. In embodiments including the alignment protrusions 440 on at least two sides, an operator or automated device may bring the tablet computing device 100 into contact therewith to ensure proper placement within the first disassembly fixture 402.

Further, as further illustrated in FIG. 11, the first disassembly fixture 402 may include or more localized heaters 442. The localized heaters 442 may be configured to respectively heat a localized portion of the cover panel 102. The localized heaters 422 may be positioned and configured to align with the pressure sensitive adhesive 112 (or other glue or adhesive) included in the tablet computing device 100. In this regard, in FIG. 11 each of the localized heaters 442 is configured to align with a respective corner 100C-F of the tablet computing device 100, at which the pressure sensitive adhesive 112 is located.

Accordingly, by directing heat at a particular location on the tablet computing device 100, the pressure sensitive adhesive 112 may be particularly targeted to facilitate release thereof. However, as illustrated in FIG. 12, the first disassembly fixture 402 may additionally include a first body heater 420. The first body heater 420 may be configured to heat substantially the entirety of the first engagement body 424. In this regard, the first body heater 420 may heat substantially the entirety of a surface of the cover panel 102 in contact with the first engagement body 224. Thereby, the cover panel 102 may be heated to a base temperature that assists in separating the cover panel from the housing 104 may loosening the bond formed by the pressure sensitive adhesive 112. However, it may be desirable to maintain the temperature to which the first body heater 420 heats the first engagement body 424 at or below a threshold temperature below which damage to any of the components of the tablet computing device 100 occurs. In this regard, certain components such as magnets may be damaged by excessive heat. In some embodiments the threshold temperature may comprise approximately from about 60 degrees Celsius to about 70 degrees Celsius, and preferably about 65 degrees Celsius, which may avoid damage to magnets and other components. The first body heater 420 may be configured to substantially maintain the temperature of the first engagement body 424 at or below the threshold temperature.

In contrast, the localized heaters 442 may be configured to heat the localized portions of the cover panel 102 to a second temperature that is higher than the first temperature to which the first body heater 420 heats the first engagement body 424 and the cover panel. However, in order to avoid damage to the components of the tablet computing device 100, the heat may be applied locally, at selected portions of the tablet computing device at which the pressure sensitive adhesive 112 is located and at which heat sensitive components are not located. The temperature to which the first body heater 420 and/or the localized heaters heat may be monitored (e.g., via thermocouples) and controlled (e.g., by the controller 214).

Further, in order to avoid issues with respect to the heat from the localized heaters 442 damaging any heat-sensitive components of the tablet computing device 100, the localized heaters may be configured for a limited period of time. For example, the localized heaters 442 may produce heat after separation force is applied between the cover panel 102 and the housing. In this regard, the localized heaters 442 may rapidly heat and then rapidly cool after heat is applied for a desired length of time. For example, current may be applied to the localized heaters from about 1 second to about 10 seconds, and preferably about 5 seconds in some embodiments in order to loosen the pressure sensitive adhesive 112 without unduly heating surrounding components of the tablet computing device. Additionally, in some embodiments active cooling (e.g., via a coolant flow through a portion of the first engagement body) may be employed to prevent the localized heaters from undesirably heating other portions of the tablet computing device 100.

In some embodiments the localized heaters 442 may comprise ceramic heaters which may employ resistive heating to produce heat. Ceramic heaters may be desirable in that they may be configured to quickly heat and cool. However, various other embodiments of heaters may be employed. Further, various other heating mechanisms such as inductive heating or heating via light emitting diodes may be employed.

As illustrated in FIG. 11, each of the localized heaters 442 may be received in a respective cutout 444 defined in the first engagement body 424. Accordingly, the localized heaters 442 may sit substantially flush with a remainder of the first engagement body 424. A sealant (e.g., silicone) may be received in the cutouts 444 to prevent loss of suction therethrough. In this regard, the localized heaters 442 may include wires 446 extending therefrom and through the first engagement body 424 to a controller (e.g., the controller 214) for control thereof in the manner described herein.

Figure 13:
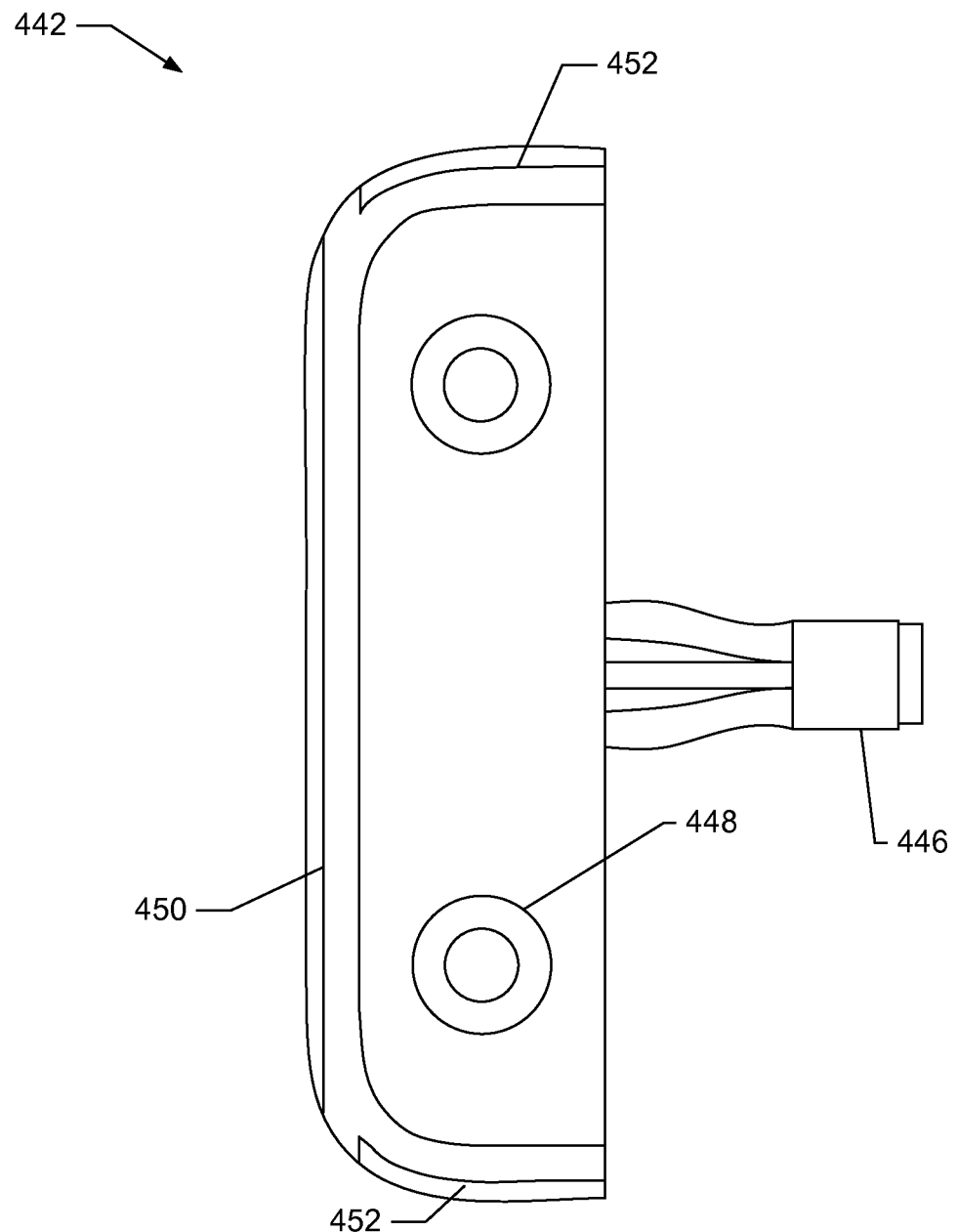
FIG. 13 illustrates an overhead view of the localized heater from the disassembly fixture of FIG. 11 according to an example embodiment of the present disclosure.
Figure 14:
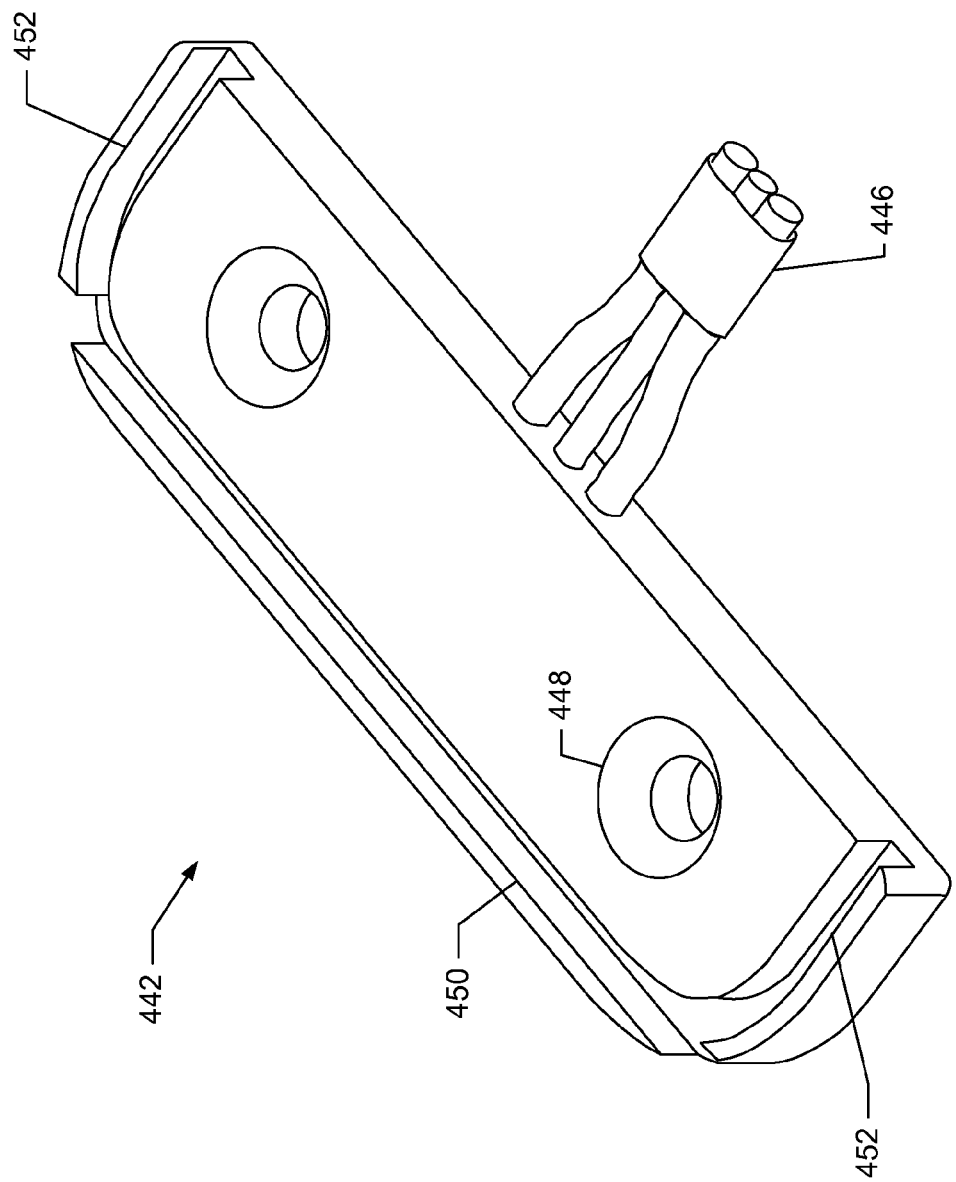
FIG. 14 illustrates a top perspective view of the localized heater from the disassembly fixture of FIG. 11 according to an example embodiment of the present disclosure.
Figure 15:
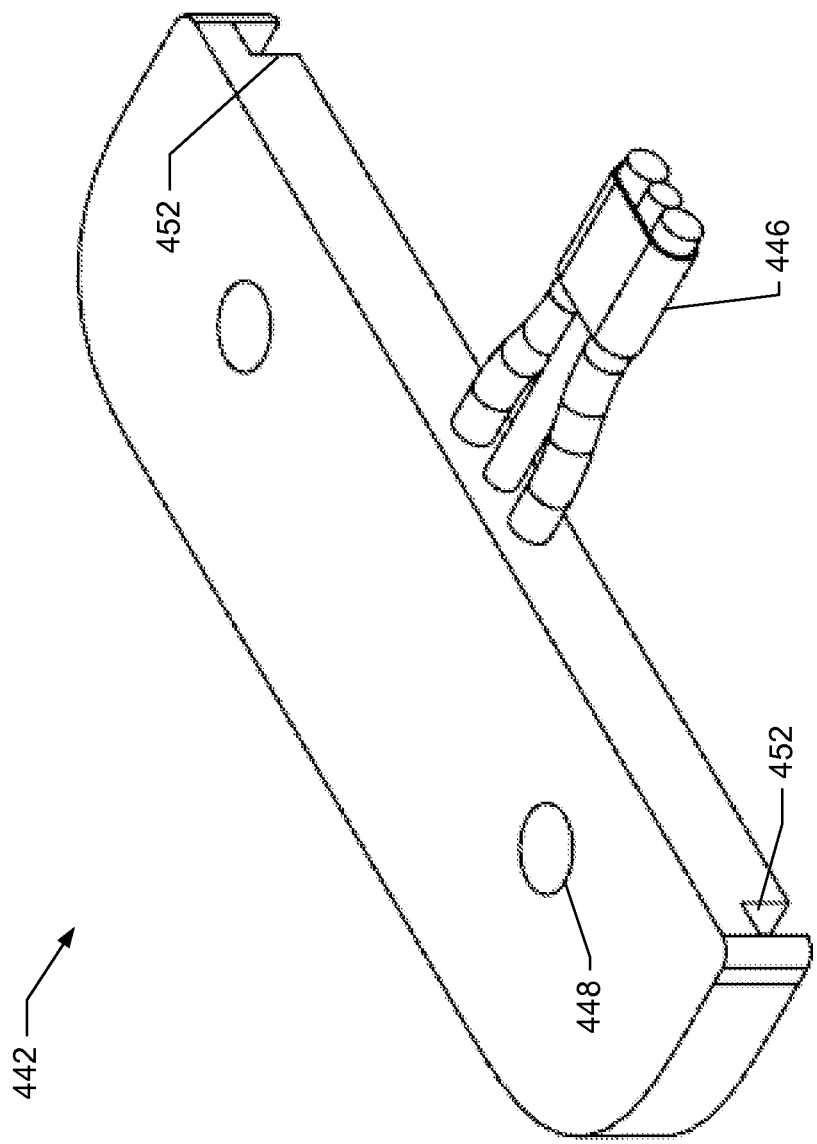
FIG. 15 illustrates a bottom perspective view of the localized heater from the disassembly fixture of FIG. 11 according to an example embodiment of the present disclosure.

FIGS. 13-15 illustrate perspective and top views of one of the localized heaters 442. As illustrated, the localized heaters 442 may include holes 448 configured to receive fasteners to secure the localized heaters to the first engagement body 424. Further, the localized heaters may include grooves therein. The grooves may include a lateral groove 450 and two end grooves 452, such that the grooves are substantially symmetrical. The grooves 450, 452 may be configured to receive the sealing member 436 such that suction loss is substantially avoided at the localized heaters 442. In particular, as illustrated in FIG. 11, the sealing member 436 may be received in the lateral groove 450 and one of the two end grooves 452 depending on the particular orientation of the localized heater. Thus, the symmetrical configuration of the grooves 450, 452 in the localized heaters 442 may allow for use of the localized heaters at each corner, rather than employing differing localized heaters at each corner.

Figure 16:
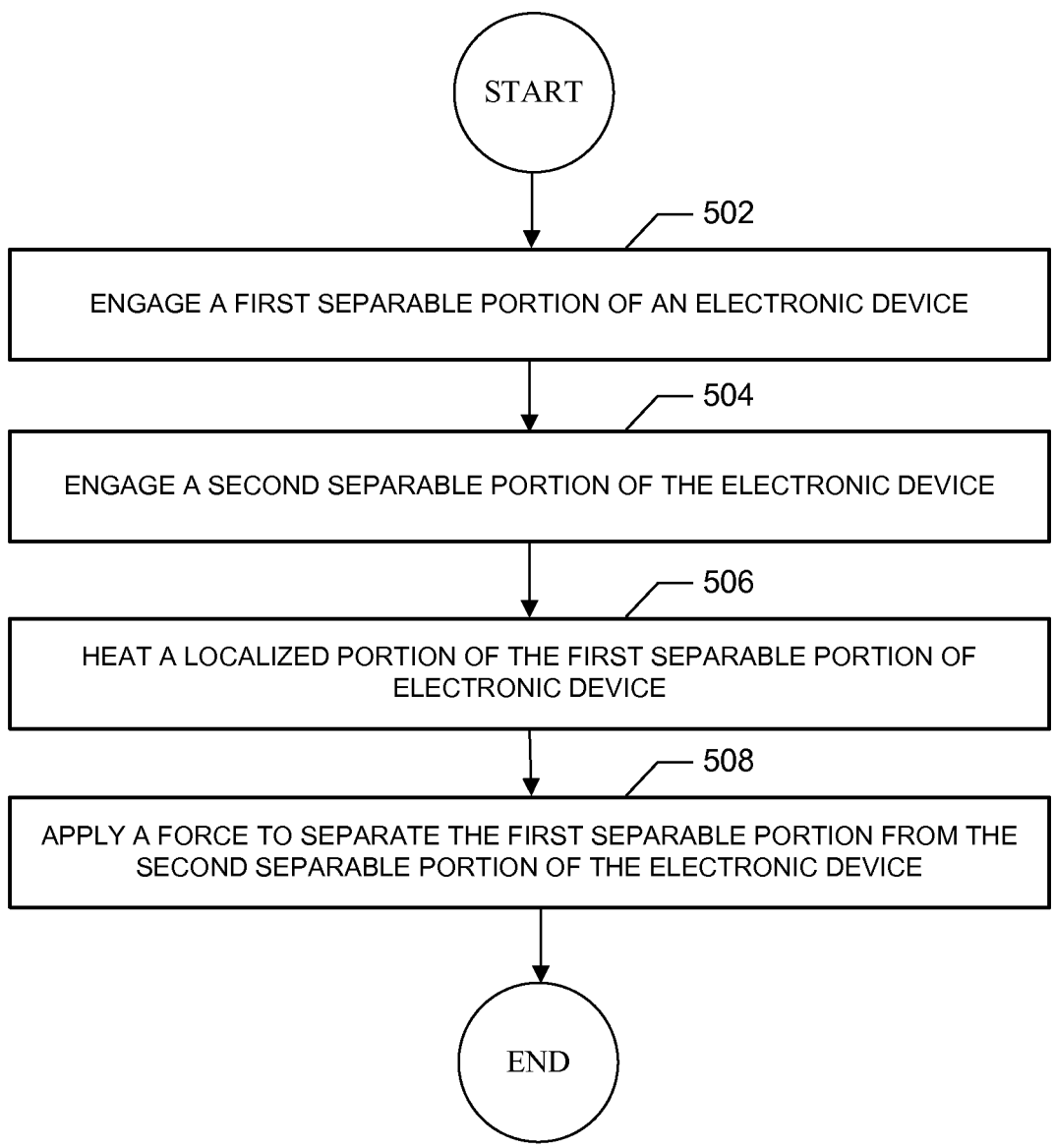
FIG. 16 schematically illustrates a method for disassembling an electronic device according to an example embodiment of the present disclosure.

A method for disassembling an electronic device is also provided. As illustrated in FIG. 16, the method may include engaging a first separable portion of an electronic device at operation 502. Further, the method may include engaging a second separable portion of the electronic device at operation 504. The method may also include heating a localized portion of the first separable portion of electronic device at operation 506. Additionally, the method may include applying a force to separate the first separable portion from the second separable portion of the electronic device at operation 508.

In some embodiments of the method heating the localized portion of the first separable portion of the electronic device at operation 506 may include heating the localized portion after beginning to apply the force. This configuration may apply tension to the pressure sensitive adhesive such that heating thereof may cause immediate separation. However, the localized heating may occur simultaneously with applying the force, or before applying the force in other embodiments. Further, applying the force to separate the first separable portion from the second separable portion at operation 508 may include linearly displacing the second separable portion from the first separable portion. However, separation may occur in other manners, such as via hinged or pivoting movement.

The method may also include heating substantially an entirety of a surface of the first separable portion. Heating substantially the entirety of the surface of the first separable portion may include heating the surface of the first separable portion to a first temperature that is less than a second temperature to which the localized portion is heated at operation 506. Additionally, the method may include limiting the force below a threshold force.

Figure 17:
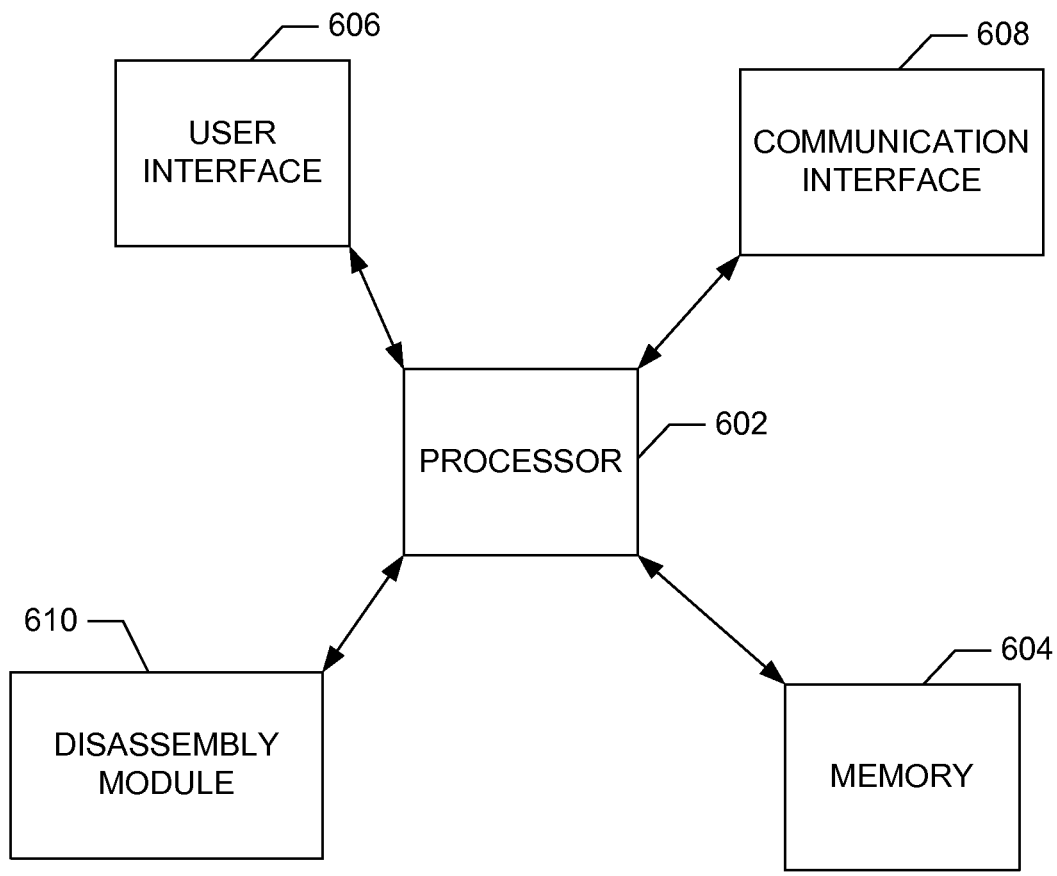
FIG. 17 schematically illustrates a block diagram of an electronic device according to an example embodiment of the present disclosure.

FIG. 17 is a block diagram of an electronic device 600 suitable for use with the described embodiments. In one example embodiment the electronic device 600 may be embodied in or as a controller configured for controlling disassembly operations as disclosed herein. In this regard, the electronic device 600 may be configured to control or execute the above-described disassembly operations performed by the disassembly apparatuses 200, 300. In this regard, the electronic device 600 may be embodied in or as the controller 214.

The electronic device 600 illustrates circuitry of a representative computing device. The electronic device 600 may include a processor 602 that may be microprocessor or controller for controlling the overall operation of the electronic device 600. In one embodiment the processor 602 may be particularly configured to perform the functions described herein relating to disassembly of devices such as the tablet computing device 100. The electronic device 600 may also include a memory device 604. The memory device 604 may include non-transitory and tangible memory that may be, for example, volatile and/or non-volatile memory. The memory device 604 may be configured to store information, data, files, applications, instructions or the like. For example, the memory device 604 could be configured to buffer input data for processing by the processor 602. Additionally or alternatively, the memory device 604 may be configured to store instructions for execution by the processor 602.

The electronic device 600 may also include a user interface 606 that allows a user of the electronic device 600 to interact with the electronic device. For example, the user interface 606 can take a variety of forms, such as a button, keypad, dial, touch screen, audio input interface, visual/image capture input interface, input in the form of sensor data, etc. Still further, the user interface 606 may be configured to output information to the user through a display, speaker, or other output device. A communication interface 608 may provide for transmitting and receiving data through, for example, a wired or wireless network such as a local area network (LAN), a metropolitan area network (MAN), and/or a wide area network (WAN), for example, the Internet.

The electronic device 600 may also include a disassembly module 610. The processor 602 may be embodied as, include or otherwise control the disassembly module 610. The disassembly module 610 may be configured for controlling or executing the disassembly operations as discussed herein.

In this regard, for example, in one embodiment a computer program product comprising at least one computer-readable storage medium having computer-executable program code portions stored therein is provided. The computer-executable program code portions, which may be stored in the memory device 604, may include program code instructions for performing the disassembly operations disclosed herein, including one or more of the operations described above in reference to FIG. 16, and may be executed via a processor such as the processor 602.

Although the foregoing disclosure has been described in detail by way of illustration and example for purposes of clarity and understanding, it will be recognized that the above described disclosure may be embodied in numerous other specific variations and embodiments without departing from the spirit or essential characteristics of the disclosure. Certain changes and modifications may be practiced, and it is understood that the disclosure is not to be limited by the foregoing details, but rather is to be defined by the scope of the appended claims.

What is claimed is:

1. A disassembly fixture, comprising:
an engagement body configured to engage a first part of an electronic device, the electronic device having a second part held by a fixture, the engagement body secured to an actuator that applies a force that moves the engagement body such that the first part separates from the second part;
a body heater that heats the engagement body;
a suction source configured to produce a suction;
a suction effector coupled to the engagement body and configured to apply the suction produced by the suction source to the electronic device to couple the electronic device to the engagement body; and
a localized heater coupled to the engagement body and configured to respectively heat a localized portion of the electronic device.

2. The disassembly fixture of claim 1, wherein the localized heater comprises a ceramic heater.

3. The disassembly fixture of claim 1, wherein the suction effector comprises channels defined in the engagement body.

4. The disassembly fixture of claim 3, further comprising a connector aperture extending through the engagement body between the suction source and the suction effector.

5. The disassembly fixture of claim 4, wherein the channels comprises a connector channel and a plurality of concentric channels extending around the connector aperture.

6. The disassembly fixture of claim 3, further comprising a sealing member extending around the channels.

7. The disassembly fixture of claim 1, wherein the localized heater is configured to align with a corner of the electronic device.

8. A disassembly apparatus, comprising:
a first disassembly fixture configured to engage a first separable portion of an electronic device by a first suction effector that produces a first suction, the first disassembly fixture further comprising:

an engagement body, and
a body heater that heats the engagement body;
a second disassembly fixture configured to engage a second separable portion of the electronic device by a second suction effector that produces a second suction;
an actuator configured to apply a force to separate the first separable portion from the second separable portion when the first suction effector secures the first separable portion with the first suction and when the second suction effector secures the second separable portion with the second suction; and
a localized heater configured to heat a localized portion of the first separable portion of electronic device.

9. The disassembly apparatus of claim 8, wherein the actuator is configured to linearly displace the second disassembly fixture from the first disassembly fixture.

10. The disassembly apparatus of claim 8, further comprising a load cell coupled to the actuator and configured to detect a load applied between the first separable portion and the second separable portion of the electronic device.

11. The disassembly apparatus of claim 8, wherein the first suction effector comprises channels defined in the engagement body.

12. The disassembly apparatus of claim 8, wherein the first disassembly fixture further comprises alignment protrusions configured to align the electronic device with the first disassembly fixture.

13. A disassembly method for separating an electronic device, the disassembly method comprising:
engaging a first separable portion of the electronic device with a first disassembly fixture that includes an engagement body having a first suction effector that produces a first suction, the first disassembly fixture further comprising a body heater that heats the engagement body;
engaging a second separable portion of the electronic device with a second disassembly fixture that includes a second suction effector that produces a second suction;
heating a localized portion of the first separable portion of electronic device; and
applying, by an actuator, a force to separate the first separable portion from the second separable portion of the electronic device when the first suction effector secures the first separable portion with the first suction and when the second suction effector secures the second separable portion with the second suction.

14. The method of claim 13, wherein heating the localized portion of the first separable portion of the electronic device comprises heating the localized portion after beginning to apply the force.

15. The method of claim 13, wherein applying the force to separate the first separable portion from the second separable portion comprises linearly displacing the second separable portion from the first separable portion.

16. The method of claim 13, further comprising heating substantially an entirety of a surface of the first separable portion.

17. The disassembly apparatus of claim 8, further comprising a hinge coupled with the first disassembly fixture, when the actuator applies the force to the first disassembly fixture, the hinge allow the first disassembly fixture to rotate with respect to the second disassembly fixture.

18. The disassembly apparatus of claim 8, further comprising:
a load cell that a detects a load applied between the first separable portion and the second separable portion; and
a display that outputs an indication of the load.

19. The disassembly apparatus of claim 8, further comprising a second actuator coupled with the first disassembly fixture, wherein the actuator and the second actuator combine to provide a linear displacement of the first separable portion with respect to the second separable portion.

20. The disassembly apparatus of claim 8, wherein the localized heater comprises a wire that extends into a cutout defined in the engagement body.

* * * * *